(12) United States Patent
Verdiell (10) Patent No.: US 7,450,858 B2
(45) Date of Patent: Nov. 11, 2008

(54) APPARATUS AND METHOD FOR TRANSMITTING AND RECEIVING WAVELENGTH DIVISION MULTIPLEXING SIGNALS

(75) Inventor: Jean-Marc Verdiell, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 778 days.

(21) Appl. No.: 10/750,278

(22) Filed: Dec. 31, 2003

(65) Prior Publication Data

US 2005/0147419 A1    Jul. 7, 2005

(51) Int. Cl.
*H04B 10/00* (2006.01)
(52) U.S. Cl. .............................. 398/164; 398/85; 398/86
(58) Field of Classification Search ................. 398/163, 398/164, 85–87
See application file for complete search history.

(56) References Cited

U.S. PATENT DOCUMENTS

| 6,493,121 | B1 * | 12/2002 | Althaus ...................... 398/135 |
| 2002/0154857 | A1 * | 10/2002 | Goodman et al. ............. 385/24 |
| 2003/0048513 | A1 * | 3/2003 | Bloom et al. ................ 359/152 |
| 2003/0076559 | A1 * | 4/2003 | Richard et al. .............. 359/123 |
| 2003/0108353 | A1 * | 6/2003 | Nasu et al. .................... 398/91 |

* cited by examiner

*Primary Examiner*—Dzung D Tran
(74) *Attorney, Agent, or Firm*—Marshall, Gerstein & Borun LLP (57) ABSTRACT

An optical sub-assembly (OSA) apparatus for use in an optical transmission system comprises a housing, a plurality of TO-can packaged optical devices, and a plurality of wavelength selective filters. Each of the plurality of TO-can packaged optical devices is sensitive to optical signal of one of a plurality of wavelengths. Each of the plurality of wavelength selective filters is capable of directing an optical signal of the one of the plurality of wavelengths in a pre-determined direction. The OSA apparatus can be used as one of an optical signal receiving apparatus and an optical signal transmitting apparatus.

41 Claims, 11 Drawing Sheets

APPARATUS AND METHOD FOR TRANSMITTING AND RECEIVING WAVELENGTH DIVISION MULTIPLEXING SIGNALS

TECHNICAL FIELD

This patent relates to wavelength division multiplexed optical transmission systems in general and, more particularly, to optical devices used in wavelength division multiplexed optical transmission systems.

BACKGROUND

The need for communication bandwidth capacity has increased dramatically in the last two decades and continues on an exponential growth path. To fill this need communications companies have invested large sums into developing infrastructures to transmit information. One of the various methods of transmitting large quantities of information that has experienced much growth in the last decade utilizes optical fibers and transmits information in the form of modulated optical signals through these fibers. A communication system using optical fiber uses transmitters at one end that typically convert electrical signals into optical signals that are transmitted through the fiber, and receivers that convert optical signals into electrical signals at the other end of the fiber carrying the optical signal.

Typically, a fiber optic transmitter uses a laser diode or other light emitting device (LED) to optically encode information and generate an optical output at various optical wavelengths, e.g., 850 nm, 1310 nm, 1550 nm etc. The optical fiber transmits the encoded information in optical form to a receiver which then converts the optical signal to an electrical signal. The optical fiber may be either single-mode or multi-mode. Typical receivers incorporate optoelectronic transducers such as photo-detectors to convert the optical signal to an electrical signal. A data demodulator then converts the data back into its original electrical form.

In order to increase transmission rates, a method of transmission known as wavelength division multiplexing (WDM) was developed for sending several different signals through a single fiber at different wavelengths. In WDM, different wavelength channels are multiplexed in the optical domain. A WDM system components include a multiplexing apparatus at the transmitting end of the WDM system to allow different wavelengths channels to be joined into a composite output signal for transmission and a de-multiplexing apparatus at the receiving end of the WDM system to allow different wavelengths channels to be separated back into their original signals. The farther apart the wavelengths channels are, the easier it is to design and fabricate the multiplexing and de-multiplexing hardware.

There are two commonly used WDM technologies, namely, coarse wavelength division multiplexing (CWDM) and dense wavelength division multiplexing (DWDM). Coarse wavelength division multiplexing (CWDM) is typically used up to 16 channels and dense wavelength division multiplexing (DWDM) allow up to several hundreds of signals to be combined into a single fiber. DWDM allow a multiple wavelength transmission in the C-Band (1550 nm) and more recently in the S-Band and L-Band as well. CWDM schemes have been used in many wavelength bands including near 850 nm, 1300 nm and all bands at 1500 nm. CWDM can also be used to emulate 10 Gbits/second data transmission by multiplexing 4 signals having different wavelengths, each with a data rate of 2.5 Gbits/second.

Typically, laser diodes are used at the transmitting end of a WDM system to convert a multiplexed electrical signal into an optical signal at to be transmit the optical signal into an optical fiber. Laser diodes used for WDM systems are predominantly distributed-feedback (DFB) chips. In practice, such lasers use costly packaging techniques (butterfly housings with thermoelectric coolers) to couple the light of the laser chip to the fiber and prevent the wavelength from drifting. One individual package is used for each laser, and an additional package is used for the wavelength multiplexer. The cost of packaging optical components severely affects the overall cost effectiveness of fiber optic communication systems. As much as eighty percent of the cost of WDM optical component is generally tied up in packaging. Similar problems also exist for photo detectors used at the receiving end of the WDM system.

Despite this high costs, fiber optic based solutions dominate long-haul communications because of the unsurpassed bandwidth and low loss advantages of optical fiber. However, in access applications, or in metro area applications, where there are other viable copper-based alternatives, the cost of packaging optical components severely limits the competitiveness of fiber optic systems against copper solutions. Therefore it is important to find cost effective solutions for packaging optical components.

BRIEF DESCRIPTION OF THE DRAWINGS

The present patent is illustrated by way of examples and not limitations in the accompanying figures, in which like references indicate similar elements, and in which.

DETAILED DESCRIPTION OF THE EXAMPLES

A method of building a WDM optical sub-assembly (OSA) apparatus (transmitter or receiver) using TO-can packaged optical components is disclosed. An embodiment of the OSA apparatus designed using the disclosed method includes an optical signal receiver having four TO-can packaged photodetectors sensitive to four different wavelengths, wherein four wavelength selective filters are used to ensure that optical signal of appropriate wavelength is directed towards a photodetector sensitive to that wavelength. Another embodiment of the OSA apparatus designed using the disclosed method includes an optical signal transmitter having four TO-can packaged laser sources, wherein four wavelength selective filters are used to ensure that optical signal generated by each of the laser sources is directed towards an optical coupling lens connecting the OSA apparatus to an optical fiber carrying an optic signal.

Figure 1:
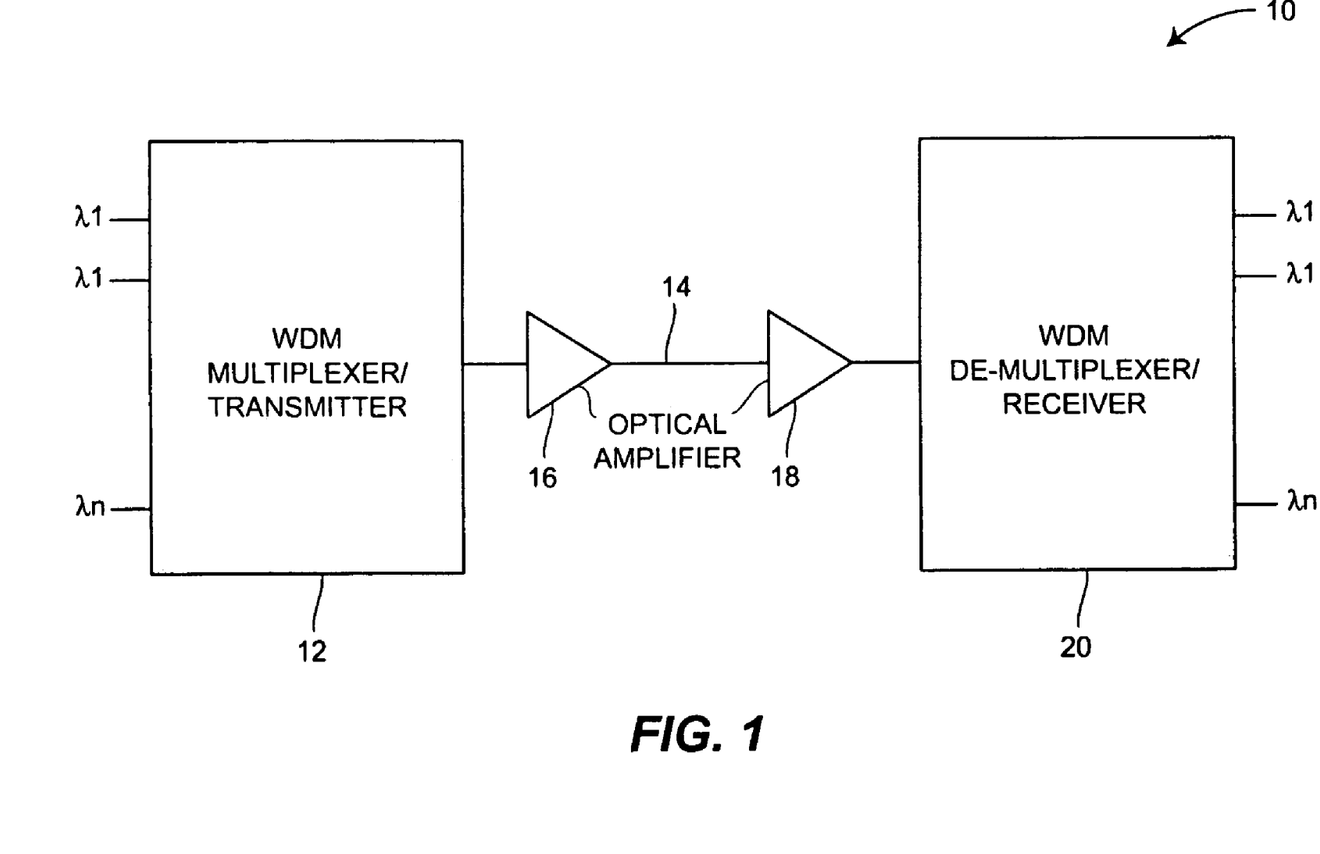
FIG. 1 illustrates an exemplary optical fiber transmission system using wavelength division multiplexing.

FIG. 1 illustrates an exemplary optical fiber transmission system 10 using wavelength division multiplexing (WDM). The transmission system 10 comprises a multiplexer/transmitter apparatus 12, a fiber optic cable 14, one or more optical amplifiers 16, 18, and a de-multiplexer/receiver apparatus 20.

The multiplexer/transmitter apparatus 12 may be a single apparatus that both multiplexes a number of signals into one output signal having a number of different wavelengths and transmits the multiplexed signal onto an optical fiber. Alternatively, the multiplexer/transmitter apparatus 12 may be an assembly of a multiplexer and a transmitter. The multiplexer/transmitter apparatus 12 of FIG. 1 receives a number of input signals $\lambda_1, \ldots \lambda_n$, and outputs a multiplexed optical signal onto the fiber optic cable 14. Various implementations of an exemplary OSA apparatus that may be used in the multiplexer/transmitter apparatus 12 are illustrated in further detail in FIGS. 2-7.

The optical amplifiers 16, 18 may be any of the commonly used optical amplifiers. An example of widely used optical amplifiers in an optical transmission system using WDM is erbium-doped fiber amplifiers (EDFAs). EDFAs are capable of simultaneously amplifying optical signals of many wavelengths. Use of EDFAs allows using WDM for optical transmission systems spanning very long distances.

The de-multiplexer/receiver apparatus 20 may be a single apparatus that both receives a multiplexed optical signal and de-multiplexes the multiplexed optical signal into a number of output signals. Alternatively, the de-multiplexer/receiver apparatus 20 may be an assembly of a de-multiplexer and several individual receivers. The de-multiplexer/receiver apparatus 20 of FIG. 1 receives an optic signal from the optic cable 14 and de-multiplexes it into a number of output signals having wavelengths $\lambda_1, \ldots \lambda_n$. Various implementations of an exemplary OSA apparatus that may be used in the de-multiplexer/receiver apparatus 20 are illustrated in further detail in FIGS. 2-7.

Figure 2:
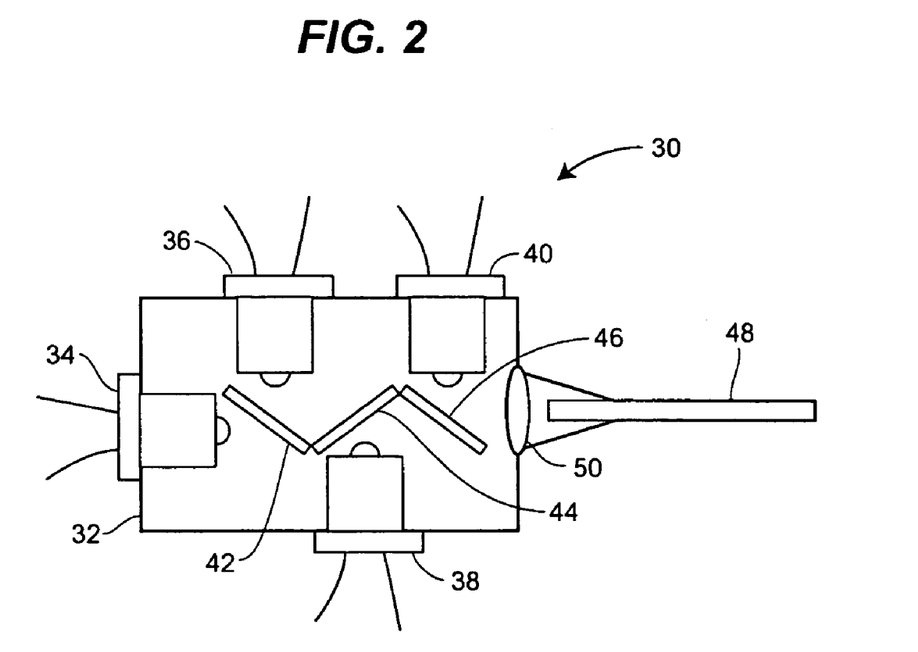
FIG. 2 illustrates an exemplary implementation of an OSA apparatus that may be used in the optical fiber transmission system of FIG. 1.

FIG. 2 illustrates an exemplary implementation of an exemplary OSA apparatus 30 that may be used in the multiplexer/transmitter apparatus 12 and in the de-multiplexer/receiver apparatus 20 of FIG. 1. The OSA apparatus 30 comprises a housing 32, a plurality of TO-can packaged optical devices 34, 36, 38 and 40, a plurality of bandwidth selective filters 42, 44 and 46, an optical fiber 48 and an optical coupling lens 50 connecting the optical fiber 48 to the housing 32.

The housing 32 may be a shell made of steel, plastic, ceramic, or any other material that is good at retaining mechanical alignment over temperature. Alternatively, the housing may be made of transparent molded plastic or other material that is transparent in infrared, such as silicon, optical polymer, etc., in a solid form.

Any of the commonly used TO-can packaged transmitters available in the industry may be used as the TO-can packaged transmitters 34-40. When the OSA apparatus 30 is used at the transmitting end of the transmission system 10 as part of the multiplexer/transmitter apparatus 12, the TO-can packaged optical devices 34-40 may be TO-can packaged transmitters. An example of a TO-can packaged transmitter is PL-CCF-00-S20-C0 manufactured by Picolight corp., of Colorado, USA, which converts an electrical signal into optical power at data rates of up to 2.5 Gbits/second.

When the OSA apparatus 30 is used at the receiving end of the transmission system 10 as part of the de-multiplexer/receiver apparatus 20, the TO-can packaged optical devices 34-40 may be TO-can packaged receivers. An example of a TO-can packaged receiver is PL-CDB-00-L23-C0 manufactured by Picolight corp., of Colorado, USA, which converts an optical power into electrical signal at data rates of up to 2.5 Gbits/second. When each of the TO-can packaged optical devices 34-40 is designed to transmit or receive optical signal at a rate of 2.5 Gbits/second, the OSA apparatus 30 having four TO-can packaged optical devices 34-40 may be used to transmit or receive optical signal at the rate of 10 Gbits/second.

Bandwidth selective filters 42-46 may be made of wavelength selective mirrors, such as multi-layered dichroic filters, where each of the wavelength selective mirrors is transparent to optical signals of all wavelengths except for a first selected wavelength, which is reflected by the mirror. Thus, filters 42-46 are used to direct optical energy of selected wavelengths into desired direction.

The optical fiber 48 can be any of the commonly used optical fiber used in optical transmissions systems. For example, data communication systems may use single-mode glass fiber or multi-mode glass fiber at one of the 780 to 850 nm, 980 nm, 1300 nm or 1500 nm bands. Alternate data communication systems may use plastic fiber-optic links. The optical coupling lens 50 can be any of the commonly used optical coupling lenses used to couple optical energy between an optical fiber and an optical transducer. An example of an optical coupling lens is a molded asphere lens such as FLAS0Z101A from Alps Electric.

When the OSA apparatus 30 is implemented at the transmitting end of the transmission system 10, the TO-can packaged optical devices 34-40 may contain transmitting elements such as lasers generating optical energy. The lasers are given electrical input signals containing information to be transmitted through the transmission system 10. Each of the lasers within the TO-can packaged optical devices 34-40 converts the input signals into optical signal, where the wavelength of the optical signal depends upon the physical characteristic of the laser. For example, a laser within the TO-can packaged optical device 34 may generate optical signal of a first optical wavelength $\lambda o_1$. In this case, the transparencies and the angles of the filters 42-46 are selected so as to allow the optical signal of wavelength $\lambda o_1$ to pass through the filters 42-46 without any deflection. As a result the optical signal of wavelength $\lambda o_1$ generated by a laser within the TO-can packaged optical device 34 will pass directly to the coupling lens 50, where the coupling lens 50 will transmit the optical signal of wavelength $\lambda o_1$ into the optical fiber 48.

Similarly, a laser within the TO-can packaged optical device 36 may generate an optical signal of a second optical wavelength $\lambda o_2$. In this case the transparencies and the angles of the filters 42-46 are selected so that the filter 42 deflects the optical signal of the second optical wavelength $\lambda o_2$ towards the coupling lens 50 and the filters 44-46 are transparent for the optical signal of the second optical wavelength $\lambda o_2$. As a result, the optical signal of wavelength $\lambda o_2$ generated by a laser within the TO-can packaged optical device 36 will be directed towards the coupling lens 50, where the coupling lens 50 will transmit the optical signal of wavelength $\lambda o_2$ into the optical fiber 48.

In a similar fashion, a laser within the TO-can packaged optical device 38 may generate an optical signal of a third optical wavelength $\lambda o_3$. In this case the transparencies and the angles of the filters 44-46 are selected so that the filter 44 deflects the optical signal of the third optical wavelength $\lambda o_3$ towards the coupling lens 50 and the filter 46 is transparent for the optical signal of the third optical wavelength $\lambda o_3$. As a result, the optical signal of wavelength $\lambda o_3$ generated by a laser within the TO-can packaged optical device 38 will be directed towards the coupling lens 50, where the coupling lens 50 will transmit the optical signal of wavelength $\lambda o_3$ into the optical fiber 48.

Finally, a laser within the TO-can packaged optical device 40 may generate an optical signal of a fourth optical wavelength $\lambda o_4$. In this case the angle of the filter 46 is selected so that the filter 46 deflects the optical signal of the fourth optical wavelength $\lambda o_4$ towards the coupling lens 50. As a result, the optical signal of wavelength $\lambda o_4$ generated by a laser within the TO-can packaged optical device 40 will be directed towards the coupling lens 50, where the coupling lens 50 will transmit the optical signal of wavelength $\lambda o_4$ into the optical fiber 48.

Whereas the OSA apparatus 30 described in FIG. 2 has each of the TO-can packaged optical devices 34-40 having a laser diode causing the OSA apparatus 30 to work as a transmitter of optical energy, in an alternate arrangement, each of the TO-can packaged optical devices 34-40 may contain a photo-detector, causing the OSA apparatus 30 to function as a receiver of optical energy. An implementation of such an OSA apparatus apparatus 60 with same schematic design as that of the OSA apparatus 30 of FIG. 2 is illustrated in FIG. 3.

Figure 3:
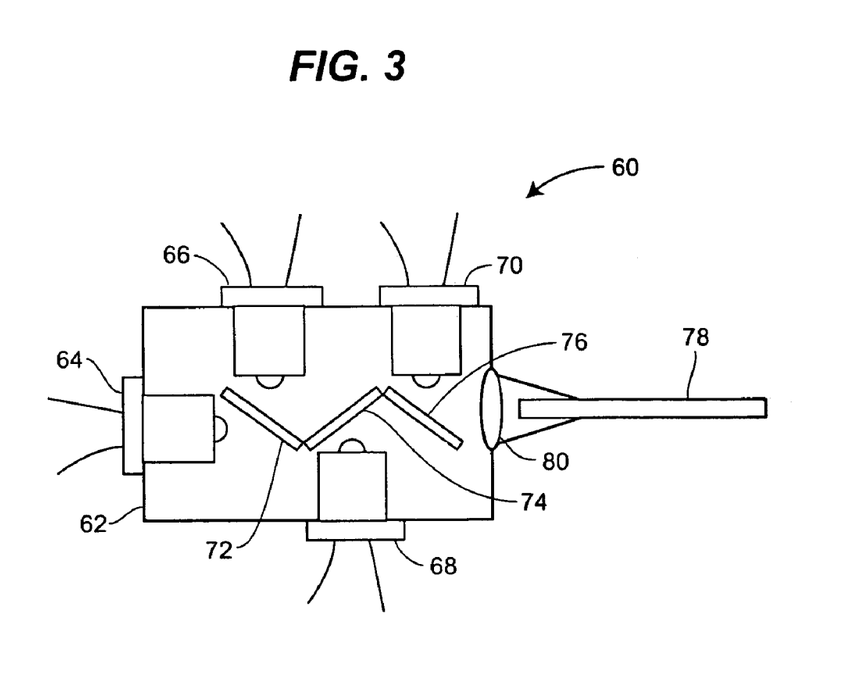
FIG. 3 illustrates an alternate implementation of an OSA apparatus that may be used in the optical fiber transmission system of FIG. 1.

The OSA apparatus 60 of FIG. 3 comprises of a housing 62, a plurality of TO-can packaged optical devices 64, 66, 68 and 70, a plurality of bandwidth selective filters 72, 74 and 76, an optical fiber 78 and an optical coupling lens 80 connecting the optical fiber 78 to the housing 72. The housing 62, the optical fiber 78 and the optical coupling lens 80 respectively are similar to the housing 32, the optical fiber 48 and the optical coupling lens 50 illustrated in FIG. 2. However, the TO-can packaged optical devices 64-70 contain photo-detectors where each of the photo-detectors is sensitive to a different bandwidth of optical signal.

While functioning as an optical signal receiver, the OSA apparatus 60 receives an optical signal from the optical fiber 78 which is input into the housing 62 via the optical coupling lens 80. In the implementation of the OSA apparatus 60 shown in FIG. 3, the optical signal inputted into the housing 62 contains four different wavelengths, $\lambda i_1$, $\lambda i_2$, $\lambda i_3$, and $\lambda i_4$. The transparencies and the angles of the filters 72-76 are selected so that only one of the wavelengths $\lambda i_1$-$\lambda i_4$ is directed to each of the photo-detectors of the TO-can packaged optical devices 64-70. Thus, the filter 76 is selected such that it is transparent to the wavelengths $\lambda i_1$-$\lambda i_3$. The angle of the filter 76 is selected such that the wavelength $\lambda i_4$ is directed towards the photo-detector within the TO-can packaged optical device 70. In an alternate implementation, additional band rejection filters may be provided in front of each of the TO-can packaged optical devices 64-70 such that optical signal of only a selected wavelength is received by each of the TO-can packaged optical devices 64-70. In yet another implementation, the photo-detectors of the TO-can packaged optical devices 64-70 are selected such that each of the photo-detectors within the TO-can packaged optical devices 64-70 is sensitive to one of the wavelengths $\lambda i_1$-$\lambda i_4$.

Similarly, the filters 72-76 direct the wavelength $\lambda i_1$ towards the photo-detector within the TO-can packaged optical device 64, the wavelength $\lambda i_2$ towards the photo-detector within the TO-can packaged optical device 66, and the wavelength $\lambda i_3$ towards the photo-detector within the TO-can packaged optical device 68. The photo-detectors within the TO-can packaged optical devices 64-70 convert the optical energy contained within the wavelengths $\lambda i_1$-$\lambda i_4$ into electrical signals. The electrical signals output from these photo-detectors may be connected to a de-multiplexer or any other device as desired.

Even though the implementations of the OSA apparatus 30 and the OSA apparatus 60 as illustrated in FIGS. 2-3 have the TO-can packaged optical devices 34-40 and 64-70 containing only one of a laser diode and a photo-detector, in an alternate implementation, the TO-can packaged optical devices 34-40 and 64-70 may contain both a laser diode and a photo-detector. In such an implementation, the filters 42-46, and 72-76 will be designed and implemented to direct optical signals from laser diodes to the optical coupling lens 50 as well as to direct optical signals from the optical coupling lens 80 to the photo-detectors.

FIGS. 4-7 describe various alternate implementations of OSA apparatuses 90, 120, 150, and 180. Even though these OSA apparatuses 90, 120, 150, and 180 are shown to have laser diodes in their TO-can packaged optical devices, as per the discussion above, it would be obvious to one of ordinary skill in the art that, these OSA apparatuses 90, 120, 150, and 180 may have their TO-can packaged optical devices containing photo-detectors. Alternately, each of the OSA apparatuses 90, 120, 150, and 180 may contain both a laser diode and a photo-detector. Given the similarity in the functioning of the OSA apparatuses 90, 120, 150, and 180 to the OSA apparatuses 30 and 60, the OSA apparatuses 90, 120, 150, and 180 are only briefly described below.

Figure 4:
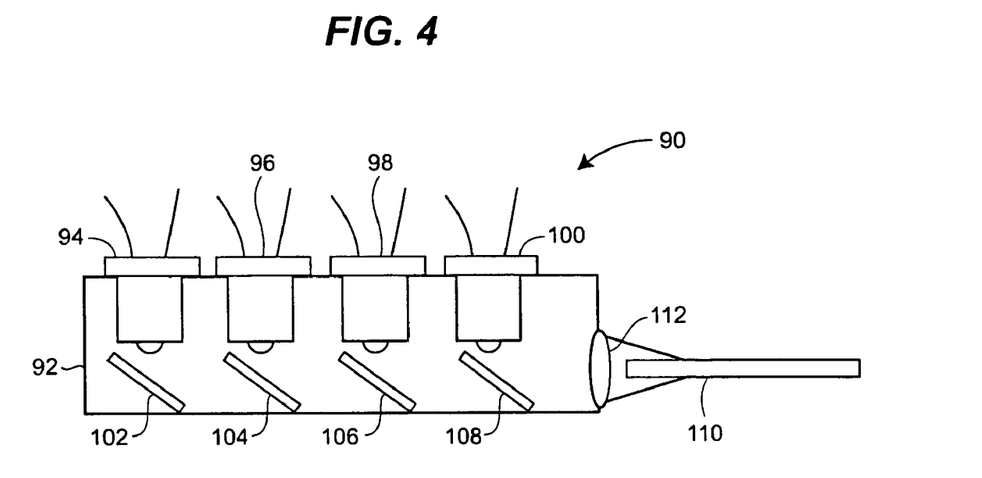
FIG. 4 illustrates yet another implementation of an OSA apparatus that may be used in the optical fiber transmission system of FIG. 1.

The OSA apparatus 90 of FIG. 4 comprises of a housing 92, a plurality of TO-can packaged optical devices 94, 96, 98 and 100, a plurality of bandwidth selective filters 102, 104, 106 and 108, an optical fiber 110 and an optical coupling lens 112 connecting the optical fiber 110 to the housing 92. The housing 92, the optical fiber 110 and the optical coupling lens 112 respectively are similar to the housing 32, the optical fiber 48 and the optical coupling lens 50 illustrated in FIG. 2. The TO-can packaged optical devices 94-100 may contain photo-detectors and/or laser diodes where each of the photo-detectors and/or laser diodes is sensitive to a different bandwidth of optical signal.

Figure 5:
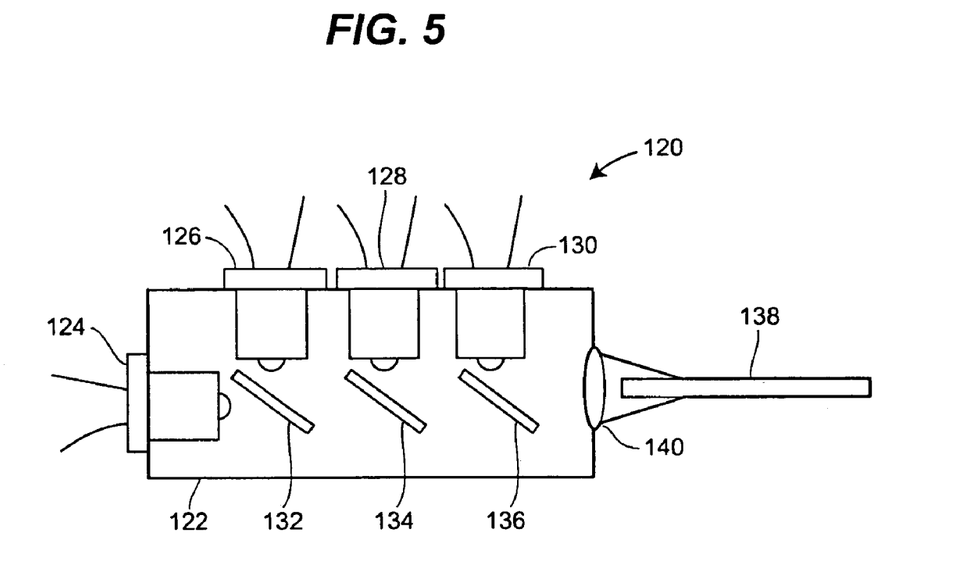
FIG. 5 illustrates yet another implementation of an OSA apparatus that may be used in the optical fiber transmission system of FIG. 1.

The OSA apparatus 120 of FIG. 5 comprises of a housing 122, a plurality of TO-can packaged optical devices 124, 126, 128 and 130, a plurality of bandwidth selective filters 132, 134 and 136, an optical fiber 138 and an optical coupling lens 140 connecting the optical fiber 138 to the housing 122. The housing 122, the optical fiber 138 and the optical coupling lens 140 respectively are similar to the housing 32, the optical fiber 48 and the optical coupling lens 50 illustrated in FIG. 2. The TO-can packaged optical devices 124-130 may contain photo-detectors and/or laser diodes where each of the photo-detectors and/or laser diodes is sensitive to a different bandwidth of optical signal.

Figure 6:
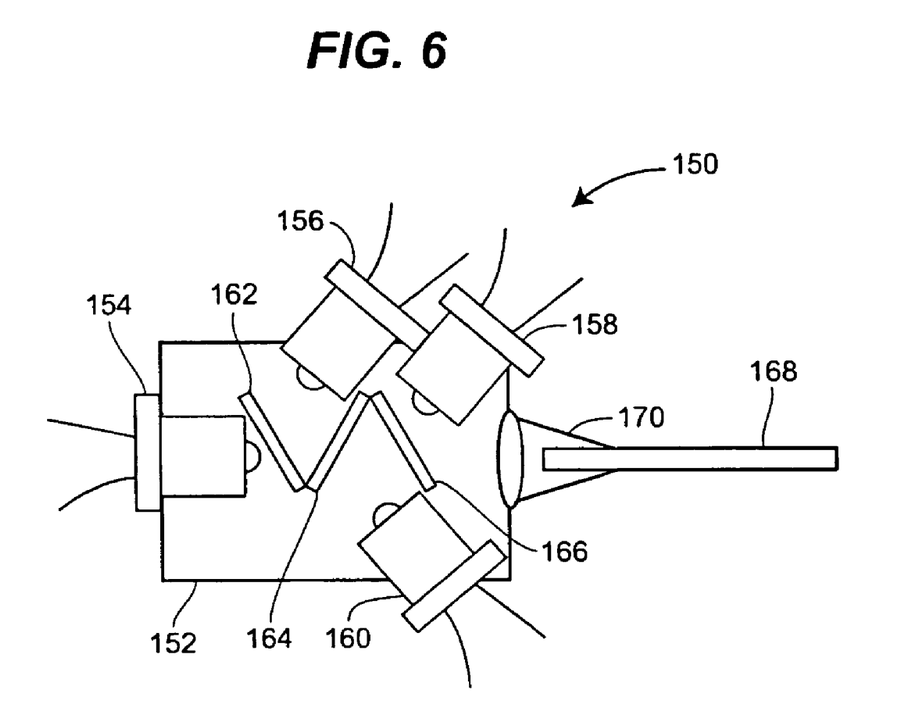
FIG. 6 illustrates yet another implementation of an OSA apparatus that may be used in the optical fiber transmission system of FIG. 1.

The OSA apparatus 150 of FIG. 6 comprises of a housing 152, a plurality of TO-can packaged optical devices 154, 156, 158 and 160, a plurality of bandwidth selective filters 162, 164 and 166, an optical fiber 168 and an optical coupling lens 170 connecting the optical fiber 168 to the housing 152. The housing 152, the optical fiber 168 and the optical coupling lens 170 respectively are similar to the housing 32, the optical fiber 48 and the optical coupling lens 50 illustrated in FIG. 2. The TO-can packaged optical devices 154-160 may contain photo-detectors and/or laser diodes where each of the photo-detectors and/or laser diodes is sensitive to a different bandwidth of optical signal.

Figure 7:
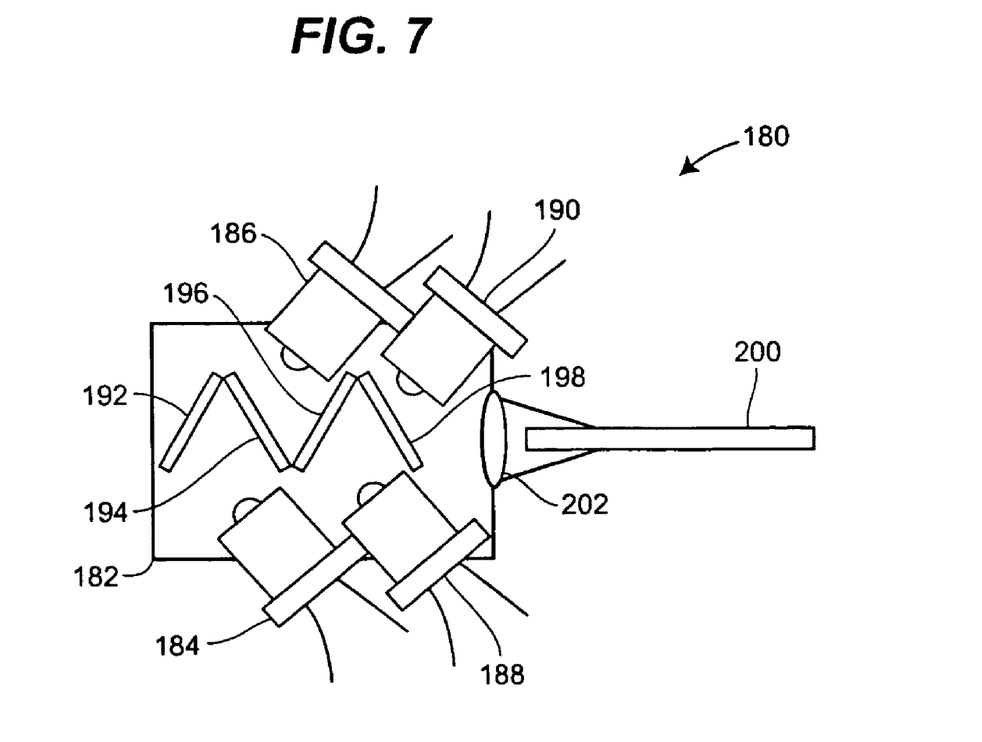
FIG. 7 illustrates yet another implementation of an OSA apparatus that may be used in the optical fiber transmission system of FIG. 1.

The OSA apparatus 180 of FIG. 7 comprises of a housing 182, a plurality of TO-can packaged optical devices 184, 186, 188 and 190, a plurality of bandwidth selective filters 192, 194, 196 and 198, an optical fiber 200 and an optical coupling lens 202 connecting the optical fiber 200 to the housing 182. The housing 182, the optical fiber 200 and the optical coupling lens 202 respectively are similar to the housing 32, the optical fiber 48 and the optical coupling lens 50 illustrated in FIG. 2. The TO-can packaged optical devices 184-190 may contain photo-detectors and/or laser diodes where each of the photo-detectors and/or laser diodes is sensitive to a different bandwidth of optical signal.

Figure 8:
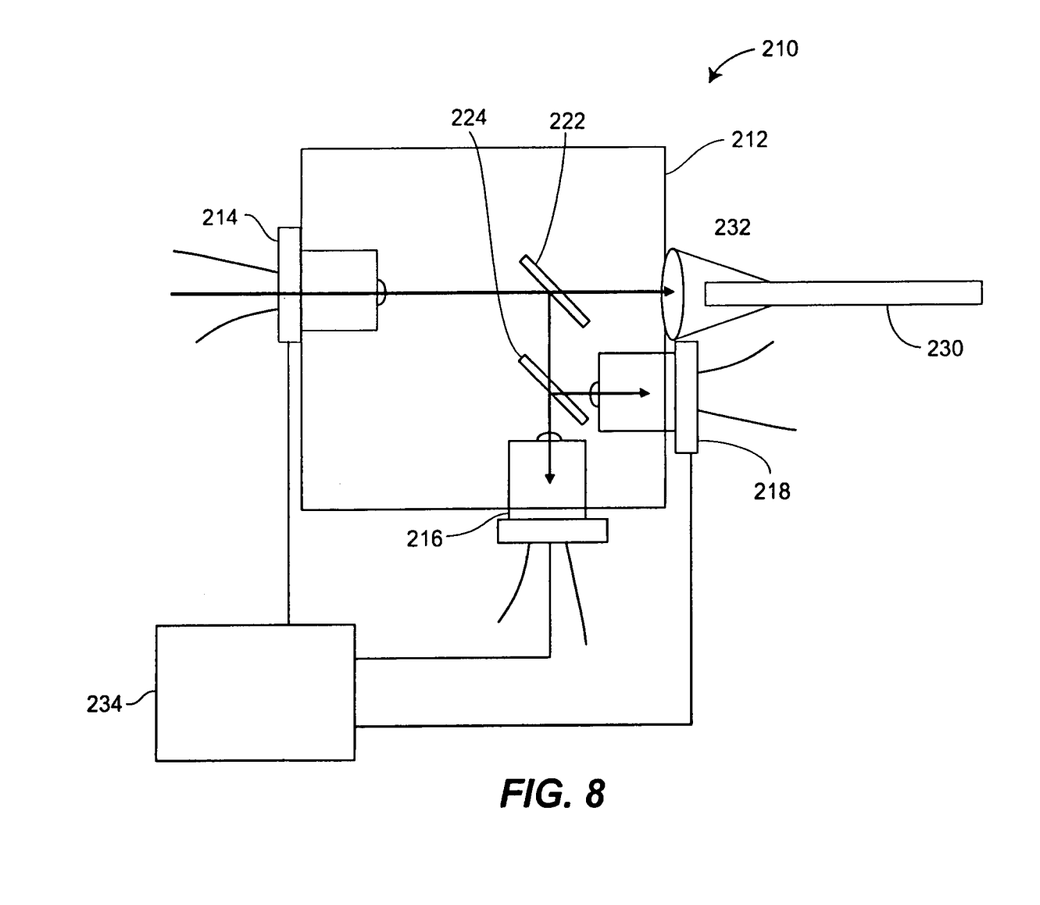
FIG. 8 illustrates yet another implementation of an OSA apparatus that may be used in the optical fiber transmission system of FIG. 1.
Figure 9:
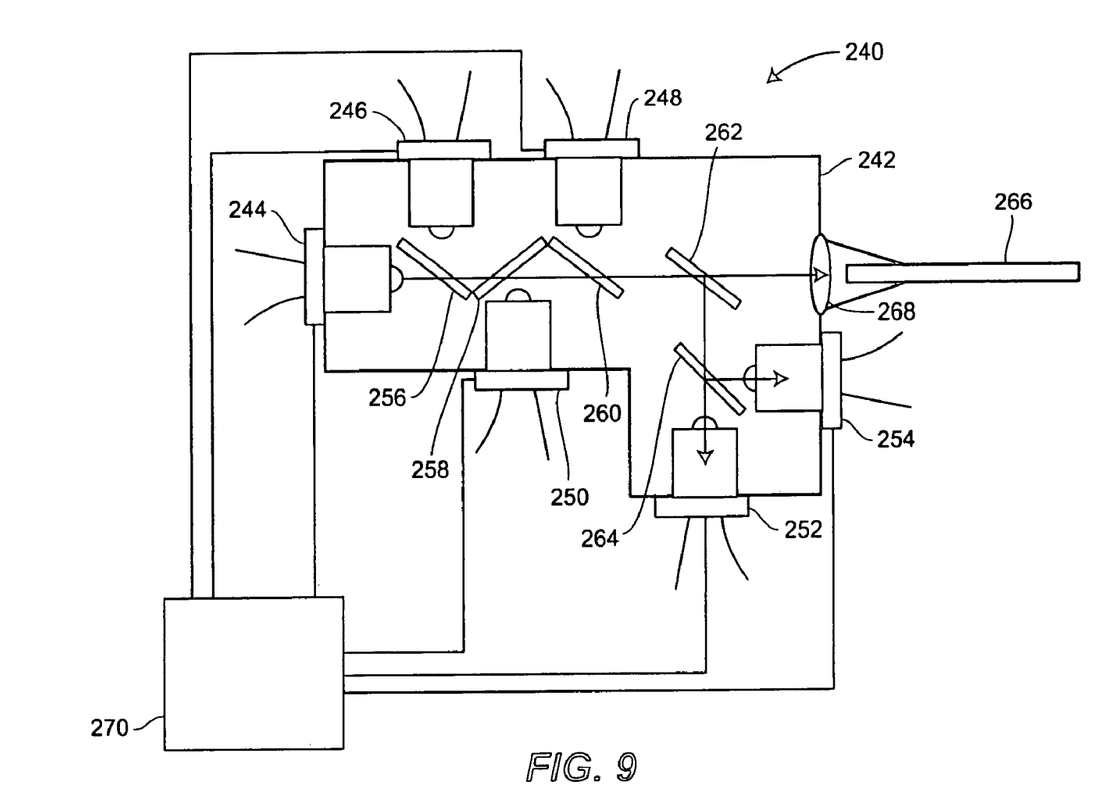
FIG. 9 illustrates yet another implementation of an OSA apparatus that may be used in the optical fiber transmission system of FIG. 1.

FIGS. 8 and 9 describe other alternate implementations of OSA apparatuses 210 and 240. Specifically, the OSA apparatus 210 of FIG. 8 describes an OSA used in a single wavelength transmitter with a wavelength locked arrangement. The OSA apparatus 210 of FIG. 8 comprises of a housing 212, a plurality of TO-can packaged optical devices 214, 216, and 218, a partially reflective mirror 222, a bandwidth selective filter 224, an optical fiber 230 and an optical coupling lens 232 connecting the optical fiber 230 to the housing 212. The housing 212, the optical fiber 230 and the optical coupling lens 232 respectively are similar to the housing 32, the optical fiber 48 and the optical coupling lens 50 illustrated in FIG. 2. The output signals from the TO-can packaged optical devices 216 and 218 are input to a first controller 234 that measures the strength of these output signals.

In the OSA apparatus 210 of FIG. 8, the TO-can packaged optical device 214 operates as a transmitter, which may contain a laser diode generating optical signal of a first wavelength. The partially reflective mirror 222, also known as a pick-up mirror, is partially transparent to optical signals such that it allows most of the energy of the optical signals to transmit through it. However, the partially reflective mirror 222 reflects a small portion of optical signals towards the bandwidth selective filter 224, where the bandwidth selective filter 224 is designed to have a wavelength-to-reflectivity slope such that at the first wavelength, the bandwidth selective filter 224 transmits a first portion of the signal through it towards the TO-can packaged optical device 216 and reflects a second portion of the signal towards the TO-can packaged optical device 218. Thus the ratio of the signal received at the TO-can packaged optical device 216 to the signal received at the TO-can packaged optical device 218 is fixed at a locking ratio of 30:70, 40:60, etc. The TO-can packaged optical devices 216 and 218 contain photo-diodes that generate electric signal in response to and in proportion to an optical signal incident upon them.

Due to the wavelength-to-reflectivity slope of the bandwidth selective filter 224, when an optical signal of the first wavelength is directed towards the bandwidth selective filter 224, the photo-diodes of the TO-can packaged optical devices 216 and 218 generate electrical signals which follow the locking ratio described above. Therefore, the first controller 234 will detect any deviation of the signals received at the TO-can packaged optical devices 216 and 218 from the locking ratio.

However, when an optical signal of a wavelength other than the first wavelength is directed towards the bandwidth selective filter 224, due to the wavelength-to-reflectivity slope of the bandwidth selective filter 224, the ratio of the strength of the optical signal transmitted through the filter 224 to the TO-can packaged optical device 216 to the strength of the optical signal reflected by the bandwidth selective filter 224 towards the TO-can packaged optical device 218 differs from the locking ratio. Thus, as a result of a deviation in the wavelength of the optical signal incident upon the bandwidth selective filter from the first wavelength, the first controller 234 will detect the ratio of the output signals generated by the TO-can packaged optical devices 216 and 218 to be different than the locking ratio. Using the difference between the actual ratio of the strengths of the output signals generated by the TO-can packaged optical devices 216 and 218, the locking ratio, and the wavelength-to-reflectivity slope of the filter 224, the first controller 234 determines whether the wavelength of the optical signal incident upon the filter 224 is higher or lower than the first wavelength and by how much.

When the OSA apparatus 210 is used in a single wavelength transmitter with a wavelength locked arrangement, in response to the wavelength of the optical signal incident upon the bandwidth selective filter 224 being different from the first wavelength, the first controller provides feedback signal to the TO-can packaged optical device 214. Such feedback signal may be to change one or more of the operating parameters of the TO-can packaged optical device 214 such that the wavelength of the optical signal generated by the TO-can packaged optical device 214 may be adjusted back to the first wavelength.

The OSA apparatus 240 of FIG. 9 describes an OSA used in quadruple wave transmitter with wavelength locked arrangement. The OSA apparatus 240 of FIG. 9 comprises of a housing 242, a plurality of TO-can packaged optical devices 244, 246, 248, 250, 252, and 254, a plurality of bandwidth selective filters 256, 258 and 260, a partially reflective mirror 262, a bandwidth selective filter 264, an optical fiber 266 and an optical coupling lens 268 connecting the optical fiber 266 to the housing 242. The housing 242, the optical fiber 266 and the optical coupling lens 268 respectively are similar to the housing 32, the optical fiber 48 and the optical coupling lens 50 illustrated in FIG. 2. The output signals from the TO-can packaged optical devices 252 and 254 are input to a second controller 270 that measures the strength of these output signals.

In the OSA apparatus 240 of FIG. 9, the TO-can packaged optical devices 244-250 operate as transmitters, each of which may contain a laser diode generating optical signal of a given wavelength, where each of such wavelengths are different from each other. The bandwidth selective filters 256-260 are used to deflect the optical signals generated by the laser diodes of the TO-can packaged optical devices 244-250 towards the optical coupling lens 268. Thus, for example, the selective filter 256 allows all of the optical signal generated by the laser diode of the TO-can packaged optical devices 244 to be transmitted to the coupling lens 268, whereas it deflects all of the optical signal generated by the laser diode of the TO-can packaged optical devices 246 towards the coupling lens 268.

The partially reflective mirror 262 is selected such that it allows most of the optical signals generated by the laser diodes of the TO-can packaged optical devices 244-250 to be transmitted towards the coupling lens 268, however, it deflects a small portion of the optical signals generated by the laser diodes of the TO-can packaged optical devices 244-250 towards the bandwidth selective filter 264. The bandwidth selective filer 264 is designed to have a strong wavelength-to-reflectivity slope such that between a minimum wavelength $\lambda_{min}$ and a maximum wavelength $\lambda_{max}$ at each interim wavelength, the filter 164 has a fixed reflectivity ratio. The functioning of the bandwidth selective filter 264 is described below using the graphs of FIGS. 10-11.

Figure 10:
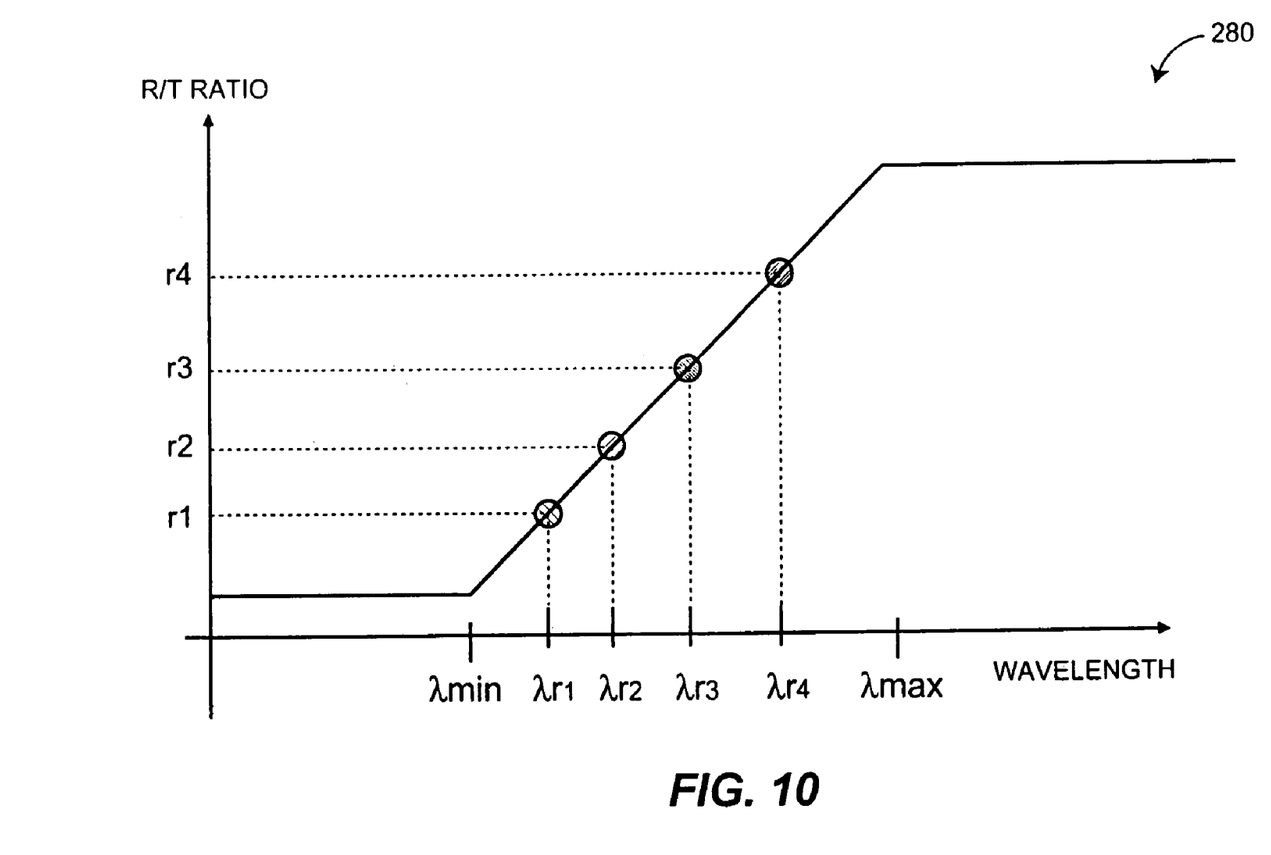
FIG. 10 illustrates a wavelength-to-reflectivity profile of a bandwidth selective filter used by the OSA apparatus of FIG. 9.

FIG. 10 shows an exemplary bandwidth-to-reflectivity graph 280 of the bandwidth selective filter 264. The wavelengths $\lambda_{r1}$-$\lambda_{r4}$ of the optical signals generated by the TO-can packaged optical devices 244-250 is between the minimum wavelength $\lambda_{min}$ and a maximum wavelength $\lambda_{max}$. In the exemplary graph 280, the reflectivity of the bandwidth selective filter 264 at each of the four wavelengths $\lambda_{r1}$-$\lambda_{r4}$ is different from each other and is given by $r_1$-$r_4$ percentages. Thus an $r_1$ percent optical energy of the optical signal of wavelength $\lambda_{r1}$ is reflected towards the TO-can packaged device 254 while the rest of the optical energy of the optical signal of wavelength $\lambda_{r1}$ is transmitted through the bandwidth selective filter 264 towards the TO-can packaged device 252, and so on. To use the slope of the bandwidth selective filter 264 to detect any drifts in the wavelengths $\lambda_{r1}$-$\lambda_{r4}$, a tone signal is added to each of the four optical signals generated by the TO-can packaged optical devices 244-250. Due to the bandwidth-to-reflectivity slope of the bandwidth selective filter 264, the tone signals added to each of the four wavelengths should also split between the TO-can packaged devices 252-254 at one of the fixed ratios $r_1$-$r_4$. Thus for example, the tone signal added to the optical signal of wavelength $\lambda_{r1}$ should split at a ratio of $r_1$, etc.

The TO-can packaged optical devices 252 and 254 contain photo-diodes that generate electric signals in response to and in proportion to an optical signal incident upon them. The electric signals generated by the photo-diodes of the TO-can packaged optical devices 252-254 are input into the second controller 270. The second controller 270 measures the ratio of the strength of the electric signals generated by TO-can packaged optical devices 252 and 254 for each of the tone signals added to the optical signals generated by the TO-can packaged optical devices 244-250. Any deviation of one of these tone signals from its expected ratio signals a drift in the optical signal carrying that tone signal. In response to a detection of deviation of a tone signal, the second controller 270 generates a corrective signal to the appropriate TO-can packaged optical devices 244-250.

Figure 11:
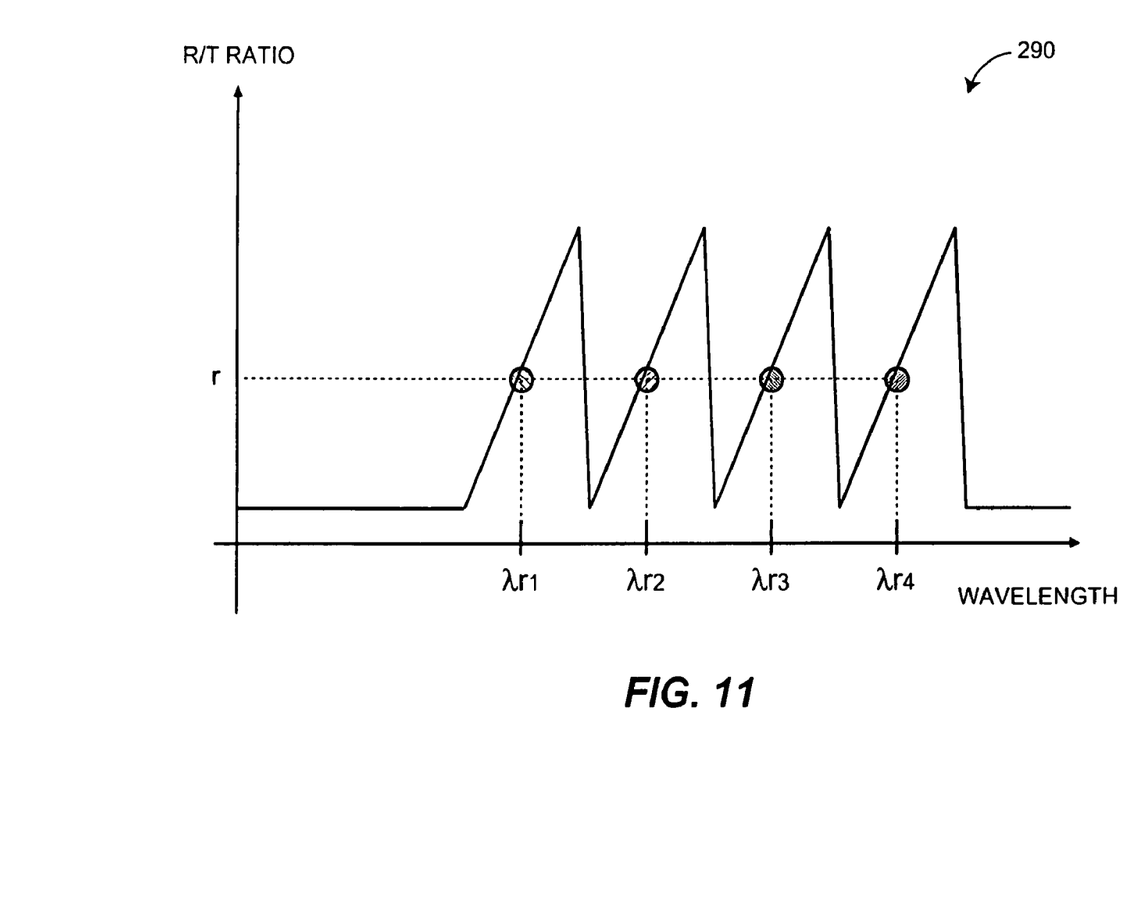
FIG. 11 illustrates an alternate wavelength-to-reflectivity profile of the bandwidth selective filter used by the OSA apparatus of FIG. 9.

FIG. 11 shows an alternate wavelength-to-reflectivity profile 290 for the bandwidth selective filter 264. For the bandwidth selective filter 264 with a wavelength-to-reflectivity profile 290, each of the wavelengths $\lambda_{r1}$-$\lambda_{r4}$ falls within one of the four notches such that optical signals at each of the four wavelengths $\lambda_{r4}$-$\lambda_{r4}$ experiences the same reflectivity ration of r. As explained earlier with respect to the graph of FIG. 10, tone signals added to each of the optical signals having wavelengths $\lambda_{r1}$-$\lambda_{r4}$ are used to monitor any drift in the wavelengths $\lambda_{r1}$-$\lambda_{r4}$.

An alternate method of measuring drifts in the wavelengths of the optical signals generated by the laser diodes of the TO-can packaged optical devices 244-250 is to operate the OSA device 240 in a calibration mode where each of the laser diodes of the TO-can packaged optical devices 244-250 is operated individually and the strength of the signal received at the TO-can packaged optical devices 252 and 254 is used to determine presence of drift in wavelength of a particular optical signal.

Based on these measured wavelengths, the second controller generates corrective feedback signals that are input to the laser diodes of the TO-can packaged optical devices 244-250. Such a closed loop monitoring by measuring the drifts in the wavelengths of the optical signals allows the OSA apparatus 240 to lock the output wavelengths of the optical signals from the TO-can packaged optical devices 244-250 against potential drifts due to change in ambient temperature, aging or any other reasons.

Even though, only a few implementations of an OSA apparatus are illustrated here, a person of ordinary skill in the art would recognize that additional implementations of the OSA apparatus are possible. For example, even though the implementations in FIGS. 2-7 illustrate four TO-can packaged optical devices, in an alternate implementation, fewer or more TO-can packaged optical devices may be included in the OSA apparatus.

Although the forgoing text sets forth a detailed description of numerous different embodiments, it should be understood that the scope of the patent is defined by the words of the claims set forth at the end of this patent. The detailed description is to be construed as exemplary only and does not describe every possible embodiment because describing every possible embodiment would be impractical, if not impossible. Numerous alternative embodiments could be implemented, using either current technology or technology developed after the filing date of this patent, which would still fall within the scope of the claims of this patent.

Thus, many modifications and variations may be made in the techniques and structures described and illustrated herein without departing from the spirit and scope of the present patent. Accordingly, it should be understood that the methods and apparatus described herein are illustrative only and are not limiting upon the scope of the patent.

What is claimed is:

1. An optical signal transmitting apparatus comprising:
a housing;
a coupling lens connected to the housing;
a primary TO-can packaged laser source generating a first optical signal having a first wavelength, wherein the first TO-can packaged laser source is positioned to transmit the first optical signal along a direct line to the coupling lens;
a plurality of TO-can packaged laser sources separate from the primary laser source and located on the housing, wherein each of the plurality of TO-can packaged laser sources generates one of a plurality of optical signals separate from the first optical signal, each of the plurality of optical signals having a different wavelength;
a plurality of wavelength selective filters located within the housing and disposed between the primary laser source and the coupling lens along the direct line, wherein the plurality of wavelength selective filters directs one of the plurality of optical signals from one of the plurality of TO-can packaged laser sources towards the coupling lens,
wherein each of the plurality of wavelength selective filters is adapted to pass the first optical signal while deflecting toward the coupling lens another optical signal generated by a one of the plurality of TO-can packaged laser sources.

2. An optical signal transmitting apparatus of claim 1, wherein the housing is connected by the coupling lens to an optical fiber carrying a wavelength division multiplexing signal, wherein the number of different wavelengths carried by the wavelength division multiplexing signal corresponds to a total number of the plurality of TO-can packaged laser sources.

3. An optical signal transmitting apparatus of claim 2, wherein the number of wavelengths carried by the wavelength division multiplexing signal is four.

4. An optical signal transmitting apparatus of claim 3, wherein the wavelength division multiplexing signal is one of a coarse wavelength division multiplexing signal and a dense wavelength division multiplexing signal.

5. An optical signal transmitting apparatus of claim 1, wherein the wavelength selective filters are multi-layered dichroic filters.

6. A method of transmitting a wavelength division multiplexing signal, the method comprising:
   applying an input signal to a primary TO-can packaged laser source and a plurality of TO-can packaged laser sources separate from the primary laser source, wherein the plurality of laser sources are located on a housing;
   generating a plurality of optical signals, where each of the plurality of optical signals has a different wavelength;
   positioning the primary TO-can packaged laser source to transmit a first optical signal having a first wavelength along a direct line to a coupling lens; and
   disposing a plurality of wavelength selective filters between the primary TO-can packaged laser source and the coupling lens along the direct line, wherein the plurality of wavelength selective filters are adapted to pass the first optical signal while deflecting toward the coupling lens another optical signal of the plurality of TO-can packaged laser sources
   wherein the coupling lens connects the housing to an optical fiber.

7. The method of transmitting a wavelength division multiplexing signal of claim 6, wherein the number of wavelengths carried by the wavelength division multiplexing signal is four.

8. The method of transmitting a wavelength division multiplexing signal of claim 6, wherein the plurality of wavelength selective filters are multi-layered dichroic filters.

9. The method of transmitting a wavelength division multiplexing signal of claim 6, wherein applying the input signal to the number of TO-can packaged laser sources is done using a de-multiplexer.

10. The method of transmitting a wavelength division multiplexing signal of claim 6, wherein the wavelength division multiplexing signal is one of a coarse wavelength division multiplexing signal and a dense wavelength division multiplexing signal.

11. The method of transmitting a wavelength division multiplexing signal of claim 6, wherein each of the wavelengths within the wavelength division multiplexing signal carries data at a rate of approximately 2.5 giga-bits per second.

12. An optical signal transmitting apparatus, comprising:
   a housing;
   a coupling lens connected to the housing;
   a TO-can packaged laser source located on the housing, where the TO-can packaged laser source generates an optical signal from an electric input signal;
   a partially reflective mirror located within the housing, where the partially reflective mirror directs portions of the optical signal from the TO-can packaged laser source towards (1) the coupling lens and (2) a second wavelength selective filter;
   a wavelength selective filter located within the housing where the second wavelength selective filter directs portions of the optical signal from the partially reflective mirror to each of a plurality of TO-can packaged photodiodes located on the housing, where the plurality of TO-can packaged photodiodes generates a plurality of electrical signals in response to the optical signal from the wavelength selective filter; and
   a controller coupled to the TO-can packaged laser source and the plurality of the TO-can packaged photodiodes, where the controller receives the plurality of electrical signals from the plurality of TO-can packaged photodiodes and in response to the plurality of electrical signals changes the electric input signal of the TO-can packaged laser source.

13. An optical signal transmitting apparatus of claim 12, wherein the coupling lens is connected to an optical fiber.

14. An optical signal transmitting apparatus of claim 12, wherein the housing is made of a solid block of one of(1) silicon, (2) glass, and (3) optically transparent plastic.

15. An optical signal transmitting apparatus of claim 12, wherein the housing is made of a shell of one of(1) steel, (2) plastic, and (3) ceramic.

16. An optical signal transmitting apparatus of claim 12, wherein the wavelength selective filter is a multi-layered dichroic filter.

17. An optical signal transmitting apparatus of claim 12, wherein the optical signal carries data at a rate of approximately 2.5 gig-bits per second.

18. An optical signal transmitting apparatus of claim 12, wherein the number of the plurality of TO-can packaged photodiodes is two.

19. An optical signal transmitting apparatus of claim 18, wherein the wavelength selective filter (1) directs optical signal of a first percentage to a first of the of the plurality of TO-can packaged photodiodes and directs the remainder of the optical signal to the second of the plurality of TO-can packaged photodiodes when the wavelength of the optical signal is equal to a first wavelength, (2) directs higher than the first percentage of optical signal to the first of the plurality of photodiodes when the wavelength of the optical signal is higher than the first wavelength, and (3) directs lesser than the first percentage of optical signal to the first of the plurality of photodiodes when the wavelength of the optical signal is lower than the first wavelength.

20. A method of transmitting an optical signal, the method comprising:
   applying a first electrical signal to a TO-can packaged laser source located on a housing;
   generating an optical signal in response to the first electrical signal;
   transmitting the optical signal towards a partially reflective mirror located within the housing;
   directing a first portion of the optical signal received at the partially reflective mirror towards an optical lens connected to an optical fiber and directing a second portion of the optical signal received at the partially reflective mirror towards a wavelength selective filter;
   directing a third portion of the optical signal received at the wavelength selective filter towards a first TO-can packaged photodiode and directing a fourth portion of the optical signal received at the wavelength selective filter towards a second TO-can packaged photodiode;
   generating a second electrical signal in response to the third portion of the optical signal received at the first TO-can packaged photodiode and generating a third electrical signal in response to the fourth portion of the optical signal received at the second TO-can packaged photodiode;
   measuring the parameters of the second electrical signal and the third electrical signal; and
   adjusting the the first electric signal of the TO-can packaged laser source in response to the measured parameters of the second electrical signal and the third electrical signal.

21. A method of transmitting an optical signal of claim 20, further comprising transmitting the first portion of the optical signal received at the coupling lens into an optical fiber.

22. A method of transmitting an optical signal of claim 20, wherein adjusting the operating parameters of the TO-can packaged laser source comprises adjusting the amount of current and the frequency of the first electrical signal applied to the TO-can packaged laser source.

23. A method of transmitting an optical signal of claim 20, wherein the optical signal carries data at a rate of approximately 2.5 giga-bits per second.

24. A method of transmitting an optical signal of claim 20, wherein the optical signal carries data in a wavelength division multiplexing format.

25. A method of transmitting an optical signal of claim 20, wherein (1) the third portion of the optical signal received at the first TO-can packaged photodiode is approximately equal to a first percentage of the optical signal received at the wavelength selective filter when the wavelength of the optical signal is equal to a first wavelength, (2) the third portion of the optical signal received at the first TO-can packaged photodiode is higher than the first percentage of the optical signal received at the wavelength selective filter when the wavelength of the optical signal is higher than the first wavelength, and (3) the third portion of the optical signal received at the first TO-can packaged photodiode is lower than the first percentage of the optical signal received at the wavelength selective filter when the wavelength of the optical signal is lower than the first wavelength.

26. An optical signal transmitting apparatus, comprising:
a housing;
a coupling lens connected to the housing;
a plurality of TO-can packaged laser sources located on the housing, where each of the plurality of TO-can packaged laser sources receives one of a first plurality of electrical signals and generates one of a plurality of optical signals from the one electric signal, each of the plurality of optical signals having a different wavelength;
a first plurality of wavelength selective filters located within the housing, where the first plurality of wavelength selective filters directs the plurality of optical signals towards the coupling lens;
a partially reflective mirror located within the housing, where the partially reflective mirror directs portions of the optical signals from the first plurality of wavelength selective filters towards (1) the coupling lens and (2) a fourth wavelength selective filter;
the fourth wavelength selective filter is located within the housing, where the fourth wavelength selective filter directs a part of each of the plurality of partially reflected optical signals towards one of a plurality of TO-can packaged photodiodes located on the housing, where each of the plurality of TO-can packaged photodiodes generates one of a second plurality of electrical signals in response to the part of the one of the plurality of partially reflected optical signals; and
a controller coupled to the plurality of TO-can packaged laser sources and the plurality of TO-can packaged photodiodes, where the controller receives the second plurality of electrical signals from the plurality of TO-can packaged photodiodes and in response to the second plurality of electric signals changes the one or more of the first plurality of electrical signals of the plurality of TO-can packaged laser sources.

27. An optical signal transmitting apparatus of claim 26, wherein the number of TO-can packaged laser sources in four.

28. An optical signal transmitting apparatus of claim 27, wherein each of the plurality of optical signals carries data at a rate of approximately 2.5 giga-bits per second.

29. An optical signal transmitting apparatus of claim 26, wherein the housing is made of a solid block of one of (1) silicon, (2) glass, and (2) optically transparent plastic.

30. An optical signal transmitting apparatus of claim 26, wherein the housing is made of a shell of one of(1) steel, (2) plastic, and (3) ceramic.

31. An optical signal transmitting apparatus of claim 26, wherein the plurality of wavelength selective filters are multi-layered dichroic filters.

32. An optical signal transmitting apparatus of claim 26, wherein each of the plurality of optical signals includes a calibrating overtone signal.

33. An optical signal transmitting apparatus of claim 26, wherein each of the plurality of the optical signal is a calibrating signal during a calibration period.

34. An optical signal transmitting apparatus of claim 26, wherein the fourth wavelength selective filter has a wavelength to reflectivity profile of one of(1) linear form and (2) saw-tooth form.

35. A method of transmitting an optical signal, the method comprising:
applying a first plurality of electrical signals to a plurality of TO-can packaged laser sources located on a housing;
generating a plurality of optical signals in response to the first plurality of electrical signals where each of the plurality of optical signals is of a different wavelength;
directing the plurality of optical signals towards a coupling lens connected to the housing;
directing a first portion of the each of the plurality of optical signals directed towards the coupling lens to a wavelength selective filter located within the housing;
directing a first percentage of the each of the plurality of optical signals directed towards the wavelength selective filter to a first TO-can packaged photodiode located on the housing;
directing a second percentage of the each of the plurality of optical signals directed towards the wavelength selective filter to a second TO-can packaged photodiode located on the housing;
generating a second plurality of electrical signals in response to the first percentage of the each of the plurality of optical signals directed towards the first TO-can packaged photodiode;
generating a third plurality of electrical signals in response to the second percentage of the each of the plurality of optical signals directed towards the second TO-can packaged photodiode;
measuring the parameters of the second plurality of electrical signals and the third plurality of electrical signals; and
adjusting the first plurality of electrical signals of the plurality of TO-can packaged laser sources in response to the measured parameters of each of the second plurality of electrical signals and the third plurality of electrical signals.

36. A method of transmitting an optical signal of claim 35, further comprising transmitting a second portion of each of the plurality of the optical signals directed towards the coupling lens into an optical fiber.

37. A method of transmitting an optical signal of claim 35, wherein each of the plurality of optical signals includes a calibrating overtone signal.

38. A method of transmitting an optical signal of claim 35, wherein each of the plurality of the optical signal is a calibrating signal during a calibration period.

39. A method of transmitting an optical signal of claim 35, wherein each of the plurality of optical signals carries data at a rate of approximately 2.5 giga-bits per second.

40. A method of transmitting an optical signal of claim 35, wherein each of the plurality of the optical signals carries data in a wavelength division multiplexing format.

41. A method of transmitting an optical signal of claim 35, wherein the wavelength selective filter has a wavelength to reflectivity profile of one of (1) linear form and (2) saw-tooth form.

* * * * *